(12) United States Patent
Minemoto et al.

(10) Patent No.: US 7,125,801 B2
(45) Date of Patent: Oct. 24, 2006

(54) METHOD OF MANUFACTURING GROUP III NITRIDE CRYSTAL SUBSTRATE, ETCHANT USED IN THE METHOD, GROUP III NITRIDE CRYSTAL SUBSTRATE, AND SEMICONDUCTOR DEVICE INCLUDING THE SAME

(75) Inventors: Hisashi Minemoto, Hirakata (JP); Yasuo Kitaoka, Ibaraki (JP); Isao Kidoguchi, Kawanishi (JP); Yusuke Mori, Katano (JP); Takatomo Sasaki, Suita (JP); Fumio Kawamura, Minoh (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/911,939

(22) Filed: Aug. 4, 2004

(65) Prior Publication Data

US 2005/0059229 A1    Mar. 17, 2005

(30) Foreign Application Priority Data

Aug. 6, 2003    (JP)    ............................. 2003-288125

(51) Int. Cl.
*H01L 21/302*    (2006.01)
(52) U.S. Cl. ............................. 438/691; 117/73; 117/77
(58) Field of Classification Search ................. 438/691; 117/73, 77
See application file for complete search history.

(56) References Cited

U.S. PATENT DOCUMENTS

2002/0037599 A1*  3/2002  Ishida et al. .................. 438/29
2004/0003495 A1*  1/2004  Xu ............................... 29/832

FOREIGN PATENT DOCUMENTS

JP    2002-293696    10/2002
WO    2004013385    2/2004

OTHER PUBLICATIONS

F.Kawamura et al., "Growth of Transpatent Large Size GaN Single Crystal with Low Dislocations Using Alkali Metal-based Flux", Japanese Association for Crystal Growth, vol. 30, No. 2, pp. 96-103 (2003).
F.A. Ponce et al., "Homoepitaxy of GaN on polished bulk single crystal by metalorganic chemical vapor desposition", Appl. Phys. Let., vol. 68, No. 7 pp. 917-919 (1996).
Y.Kaneko et al., "Melt-Back Etching of GaN", Solid-state Electrons, vol. 41, No. 2, pp. 295-298 (1997).

* cited by examiner

*Primary Examiner*—Nadine Norton
*Assistant Examiner*—Binh X. Tran
(74) *Attorney, Agent, or Firm*—Hamre, Schumann, Mueller & Larson, P.C.

(57) ABSTRACT

The present invention provides a Group III nitride crystal substrate whose surface has concavities and convexities reduced in size. The surfaces with concavities and convexities, such as hillocks, pits and facets, of Group III nitride crystals are brought into contact with a melt and thereby the surfaces are subjected to meltback etching or mechanochemical polishing. The melt includes at least one of alkali metal and alkaline-earth metal. Thus a Group III nitride crystal substrate that has reduced strain and a reduced number of defects, which are caused through the processing, and is excellent in surface flatness is manufactured. Furthermore, by the use of the Group III nitride crystal substrate of the present invention, for instance, semiconductor devices of high performance can be obtained.

29 Claims, 6 Drawing Sheets

US 7,125,801 B2

METHOD OF MANUFACTURING GROUP III NITRIDE CRYSTAL SUBSTRATE, ETCHANT USED IN THE METHOD, GROUP III NITRIDE CRYSTAL SUBSTRATE, AND SEMICONDUCTOR DEVICE INCLUDING THE SAME

BACKGROUND OF THE INVENTION

1. Field of the Invention

The present invention relates generally to a method of manufacturing a Group III nitride crystal substrate, an etchant to be used in the method, a Group III nitride crystal substrate, and a semiconductor device with the same.

2. Related Background Art

A Group III nitride compound semiconductor such as, for instance, gallium nitride (GaN) (hereinafter also referred to as a "Group III nitride semiconductor" or a "GaN-based semiconductor") has been gaining attention as a material for semiconductor devices that emit green, blue or ultraviolet light. A laser diode (LD) that emits blue light is used for high-density optical disk devices or displays while a light emitting diode (LED) that emits blue light is used for displays, lighting, etc. It is expected to use an ultraviolet LD in the field of, for example, biotechnology and an ultraviolet LED as, for example, an ultraviolet source for a fluorescent lamp.

Generally, Group III nitride semiconductor substrates (for instance, GaN substrates) that are used for LDs or LEDs are formed through vapor phase growth.

Recently, template substrates and free-standing bulk substrates have been studied as substrates to be used for semiconductor devices such as the above-mentioned LDs and LEDs. The template substrates are grown on various support substrates by a metalorganic chemical vapor deposition (MOCVD) method or hydrid vapor phase epitaxy (HVPE), while the free-standing bulk substrates are obtained by removing the support substrates after growth. Further, another method of growing a GaN crystal layer on a sapphire substrate by the MOCVD method and then growing single crystals thereon by a liquid phase epitaxy (LPE) method has been reported (see, for instance, JP2002-293696A and Japanese Association for Crystal Growth, Vol. 30, No. 2, pp. 96–103, 2003).

Furthermore, various methods for processing substrates also have been proposed (see, for instance, Appl. Phys. Let. (Vol. 68, No. 7, pp. 917–919, 1996) and Solid-state Electronics. (Vol.41, No. 2, pp. 295–298, 1997)).

Immediately after crystal growth, the surface of a Group III nitride crystal substrate has, for instance, a large number of small holes (pits), concavities and convexities (hillocks), and natural planes that are referred to as facets. Hence, when such a Group III nitride crystal substrate is used to manufacture a product such as a semiconductor device, it is necessary to process the surface of the substrate beforehand. The Group III nitride crystal substrate, however, is hard and brittle and therefore is difficult to process.

SUMMARY OF THE INVENTION

With the above in mind, the present invention is intended to provide a technique for processing the surface of a hard and brittle Group III nitride crystal substrate.

In order to achieve the above-mentioned object, a first manufacturing method of the present invention is a method of manufacturing a Group III nitride crystal substrate including a process of processing surfaces of Group III nitride crystals, wherein the process of processing the surfaces includes at least one of a process of meltback etching the surfaces by bringing the surfaces into contact with a melt including at least one of alkali metal and alkaline-earth metal and a process of mechanochemically polishing the surfaces using the melt.

Furthermore, a second manufacturing method of the present invention is a method of manufacturing a Group III nitride crystal substrate including the following processes (i) to (iv):

(i) preparing a semiconductor seed layer of a Group III element compound;

(ii) growing, on the semiconductor seed layer, a first semiconductor layer through liquid phase growth, the first semiconductor layer having a higher defect density than that of the semiconductor seed layer;

(iii) growing, on the first semiconductor layer, a second semiconductor layer through liquid phase growth, the second semiconductor layer having a lower defect density than that of the first semiconductor layer; and (iv) removing at least the semiconductor seed layer and the first semiconductor layer to obtain a free-standing Group III nitride crystal substrate formed of the second semiconductor layer. Preferably, the second manufacturing method of the present invention further includes a process of processing surfaces of Group III nitride crystals, after the processes (iv).

Furthermore, a third manufacturing method of the present invention is a method of manufacturing a Group III nitride crystal substrate including the following processes (I) to (IV):

(I) preparing a semiconductor seed layer of a Group III element compound;

(II) growing, on the semiconductor seed layer, a first semiconductor layer through liquid phase growth, the first semiconductor layer having a higher defect density than that of the semiconductor seed layer;

(III) growing, on the first semiconductor layer, a second semiconductor layer through liquid phase growth, the second semiconductor layer having a lower defect density than that of the first semiconductor layer; and (IV) processing a surface of the second semiconductor layer. In the second and third manufacturing method of the present invention, the processing the surfaces can be carried out by meltback etching of the present invention, mechanochemical polishing of the present invention, mechanical processing, common mechanochemical polishing, etc. They may be used individually or may be used in combination. When they are used in combination, it is preferable that the mechanical processing is carried out first and then mechanochemical polishing is carried out.

The manufacturing method of the present invention can provide a Group III nitride crystal substrate having reduced strain and defects that are caused through the processing. Furthermore, for instance, semiconductor devices of high performance can be obtained by using the Group III nitride crystal substrate according to the present invention.

DETAILED DESCRIPTION OF THE INVENTION

Figure 1A:
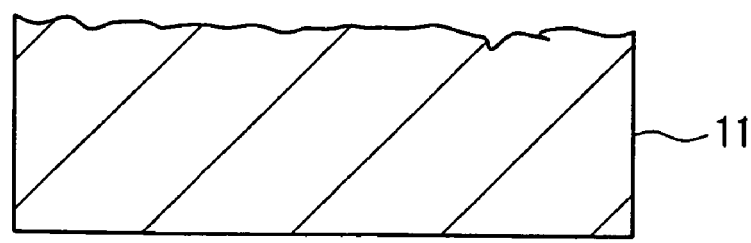
FIGS. 1A and 1B are drawings showing a process of an example of the manufacturing method according to the present invention.

In the manufacturing method of the present invention, the "meltback etching" of the present invention denotes etching that is carried out using the reverse process of liquid phase growth, i.e. a process of melting Group III nitride crystals in an unsaturated melt. Since the Group III nitride crystals are melted in an unsaturated melt, the crystals obtained thereby have reduced strain and defects that are caused through the processing. Furthermore, in the manufacturing method of the present invention, the "mechanochemical polishing" of the present invention denotes a process in which polishing, which is mechanical processing, and etching, which is chemical processing, are carried out simultaneously. Since two different types of processing are carried out simultaneously, the crystals obtained thereby have naturally reduced strain and a reduced number of defects, which are caused through the processing, as well as higher surface flatness in addition to reduced damages. Hereinafter, the meltback etching that is carried out using the melt is referred to as "meltback etching of the present invention" and the mechanochemical polishing that is carried out using the melt as "mechanochemical polishing of the present invention" while mechanochemical polishing that is carried out using, for instance, colloidal silica or colloidal diamond may be referred to as "common mechanochemical polishing".

In the present invention, examples of the process of processing the surfaces include a process of eliminating strain caused through the processing and a process of flattening the surfaces. Furthermore, in the present invention, the "Group III nitride crystal substrate" denotes both a free-standing substrate formed of Group III nitride crystals alone and a Group III nitride crystal substrate formed on a base substrate.

In the manufacturing method of the present invention, examples of the alkali metal include Na, Li, K, Rb, and Cs while examples of the alkaline-earth metal include Ca, Mg, Sr, Ba and Be. They may be used individually or two or more of them may be used together. Among them, Na, Li, Ca and Ba are preferable.

In the manufacturing method of the present invention, it is preferable that the melt further includes a Group III element. The change in amount of the Group III element contained in the melt allows the saturation degree of the melt to be adjusted and thereby allows the etching rate to be adjusted. Examples of the Group III element include Ga, Al, and In. They may be used individually or two or more of them may be used together. More preferably, a Group III element identical with that contained in the Group III nitride crystals whose surfaces are to be treated is added to the melt. For instance, when the surface of a GaN, InN, or AlN substrate is to be treated, it is preferable that the melt contains Ga, In, or Al, respectively. In the case of using a melt containing Al, since temperature of the melt may become high in some cases, it is preferable that at least one of Ga and In is added to the melt together with Al.

In the manufacturing method of the present invention, it is preferable that the melt includes Na and Ga.

In the manufacturing method of the present invention, it is preferable that in the melt, one of the following formulae is satisfied:

$$0 \leq A/(A+M) \leq 0.10 \quad (1); \text{ and}$$

$$0.9 \leq A/(A+M) \leq 0.999 \quad (2),$$

more preferably:

$$0 \leq A/(A+M) \leq 0.05 \quad (3); \text{ and}$$

$$0.95 \leq A/(A+M) \leq 0.999 \quad (4),$$

where "A" denotes the number of moles of the Group III element and "M" denotes the number of total moles of the alkali metal and alkaline-earth metal.

In the manufacturing method of the present invention, it is preferable that the melt further includes polishing grains. When the melt contains polishing grains, mechanical processing to be performed by grains and etching to be performed by alkali metal and the like can be carried out simultaneously. This allows a Group III nitride crystal substrate having reduced strain and defects that are caused through the processing and having higher flatness to be manufactured more efficiently.

In the manufacturing method of the present invention, examples of the polishing grains include alumina, diamond, SiC, GaN and AlN.

In the manufacturing method of the present invention, the polishing grains may have diameters of, for instance, 0.01 μm to 2 μm, preferably 0.05 μm to 0.5 μm.

In the manufacturing method of the present invention, when the meltback etching is carried out, the temperature of the melt is, for instance, preferably 400° C. to 900° C., more preferably 600° C. to 850° C. On the other hand, in the manufacturing method of the present invention, when the mechanochemical polishing of the present invention is carried out, the temperature of the melt is, for instance, preferably 80° C. to 200° C., more preferably 100° C. to 150° C. The mechanochemical polishing of the present invention can be carried out using a melt having a relatively low temperature as compared to the case of the meltback etching. Presumably, this is because the surface is processed using pressure provided additionally by the mechanical processing and thereby the crystal surfaces having a lot of very unstable planes (for instance, with many dangling bonds) are exposed, and as a result, the mechanochemical polishing of the present invention works even at a decreased processing temperature. The present invention, however, is not limited to this.

In the manufacturing method of the present invention, it is preferable that the processing is carried out in an atmosphere including, for instance, $N_2$ gas, $NH_3$ gas, $H_2$ gas, He gas or Ar gas. Among them, $N_2$ gas and $H_2$ gas are preferable. Furthermore, particularly when the mechanochemical polishing of the present invention is carried out, it is more preferable that it is carried out in an inert atmosphere (for instance, a glove box) including inert gas with a high purity. Examples of the inert gas include nitrogen, Ar, and He. Among them, nitrogen is preferable since it is relatively cheap and has low reactivity.

In the manufacturing method of the present invention, the atmosphere has a pressure of, for instance, 1 atm ($1 \times 1.013 \times 10^5$ Pa) to 10 atm ($10 \times 1.013 \times 10^5$ Pa).

As described above, the manufacturing method of the present invention allows concavities and convexities of the surfaces of the Group III nitride crystals to have sizes of, for example, not more than ±5 μm, preferably not more than ±2 μm, and more preferably not more than ±0.5 μm. In this context, the concavities and convexities of the crystal surfaces denote a net amount of irregularities caused at the crystal surfaces. The net amount is obtained through subtraction of the amount of irregularities caused mainly by warping of the substrate from the whole. In this case, the amount of warping of the substrate is not taken into consideration. This is because the warping of the substrate can be compensated to some degree by adjusting the way of attaching a sample in conducting exposure. In this case, the concavities and convexities of the surfaces of the Group III nitride crystals can be measured using, for instance, an interferometer that operates utilizing light interference, a flatness tester, a mechanical surface roughness meter, or an Atomic Force Microscope (AFM). Examples of the way of attaching a sample include vacuum absorption.

In the manufacturing method of the present invention, it is preferable that at least one of a process of mechanically processing the surfaces of the Group III nitride crystals and a process of subjecting the surfaces to mechanochemical polishing is carried out before the process of processing the surfaces. Examples of the processing method include diamond polishing, diamond grinding and slicing. Examples of the mechanochemical polishing include the mechanochemical polishing of the present invention and common mechanochemical polishing. The common mechanochemical polishing is carried out, for instance, using abrasive cloth and a $SiO_2$ slurry (colloidal silica). or diamond slurry (colloidal diamond).

In the processing process of the manufacturing method according to the present invention, preferably, a damaged layer formed on the surfaces of the Group III nitride crystals is removed. In this context, the "damaged layer" denotes a layer that has residual strain and stress and includes a great number of crystal defects due to the mechanical processing and the like.

In the manufacturing method of the present invention, the Group III nitride crystals to be used are not particularly limited. For instance, crystals grown through liquid phase growth or vapor phase growth and sliced bulk crystals grown through liquid phase growth or vapor phase growth can be used. Furthermore, the manufacturing method of the present invention may include a process of growing the Group III nitride crystals beforehand through at least one of the vapor phase growth and liquid phase growth. Examples of the vapor phase growth include the MOCVD method, the HVPE method and the sublimation method. Examples of the liquid phase growth include the Flux method, the liquid phase epitaxy (LPE) method and the Czochralski method.

In the manufacturing method of the present invention, when the surfaces of the Group III nitride crystals grown through the vapor phase growth are to be processed, it is more preferable that the meltback etching of the present invention, the mechanochemical polishing of the present invention, or both the common mechanochemical polishing and the meltback etching of the present invention are used. Furthermore, when the surfaces of the Group III nitride crystals grown through the liquid phase growth are to be processed, it also is possible to employ the common mechanochemical polishing alone since the Group III nitride crystals tend to have higher mechanical strength than that of Group III nitride crystals grown through the vapor phase growth. However, the use of the meltback etching of the present invention, the mechanochemical polishing of the present invention, or both the common mechanochemical polishing and the meltback etching of the present invention is more preferable.

In the manufacturing method of the present invention, it is preferable that the liquid phase growth is a method of growing Group III nitride crystals in a melt or at the surface of the melt in an atmosphere including nitrogen, with the melt containing nitrogen, at least one of alkali metal and alkaline-earth metal, and at least one Group III element selected from the group consisting of gallium, aluminum, and indium.

In the manufacturing method of the present invention, examples of the alkali metal include Na, Li, K, Rb, and Cs while examples of the alkaline-earth metal include Ca, Mg, Sr, Ba, and Be. They may be used individually or two or more of them may be used together. Among them, Na, Li, Ca and Ba are preferable. Examples of the atmosphere including nitrogen include an atmosphere containing $N_2$ gas or $NH_3$ gas.

In the manufacturing method of the present invention, it is preferable that a semiconductor seed layer of a Group III element compound is prepared, and then the Group III nitride crystals are grown on the semiconductor seed layer.

In the manufacturing method of the present invention, it is preferable that the liquid phase growth is carried out in two stages including a first stage and a second stage. The first stage corresponds to a process of forming, on the semiconductor seed layer, a first semiconductor layer having a higher defect density than that of the semiconductor seed layer, and the second stage corresponds to a process of forming, on the first semiconductor layer, a second semiconductor layer having a lower defect density than that of the first semiconductor layer. As described above, the first semiconductor layer (a high defect layer) having a higher defect density is formed while the surface of the semiconductor seed layer is melted back, and then the second semiconductor layer is grown. Accordingly, the second semiconductor layer of higher quality can be formed.

In the present invention, the "defect" is not particularly limited as long as it is a defect of the crystal structure. Examples of the "defect" include defects caused by introduction of impurities and crystal lattice defects. The impurities described above include, for instance, those originating from components of the material forming a crucible, a reactor vessel, or other members that are used for producing the crystals, and those originating from components of the material of the melt that is used in the liquid phase method. The crystal lattice defects include, for instance, dislocations (line defects). Examples of the dislocations include edge dislocations and screw dislocations. In GaN crystals, the crystal lattice defects include, for instance, defects of Ga and N. Of the defects caused in the present invention, the defects caused by the introduction of impurities can be determined by impurity analysis such as, for example, secondary ion mass spectroscopy (SIMS) or optical evaluations such as, for instance, photoluminescence (PL) evaluations. The dislocations can be determined, for example, through observation using a transmission electron microscope (TEM).

In the manufacturing method of the present invention, the second semiconductor layer can have a dislocation density that exceeds zero but is not higher than $1 \times 10^6$ cm$^{-2}$ and an impurity density of, for instance, 1 ppm to 10 ppm. Preferably, the dislocation density of the first semiconductor layer is at least 100 times higher than those of the semiconductor seed layer and the second semiconductor layer. Furthermore, it is preferable that the first semiconductor layer has a dislocation density of at least $1 \times 10^8$ cm$^{-2}$.

Preferably, the manufacturing method of the present invention further includes a process of removing at least one of the semiconductor seed layer and the first semiconductor layer, which is a high defect layer, to provide a free-standing Group III nitride crystal substrate that is formed of the second semiconductor layer. The method for removing the layers is not particularly limited but examples thereof may include mechanical grinding, others types of grinding, and meltback etching.

In the manufacturing method of the present invention, it is preferable that the semiconductor seed layer is formed on a base substrate. The base substrate can be, for example, a GaAs substrate whose surface is a (111) plane, a Si substrate whose surface is a (111) plane, a sapphire substrate whose surface is a (0001) plane, or a SiC substrate whose surface is a (0001) plane. Among them, the sapphire substrate whose surface is a (0001) plane and the SiC substrate whose surface is a (0001) plane are preferable.

The Group III nitride crystal substrate of the present invention is one obtained by the above-mentioned manufacturing method of the present invention.

The semiconductor device of the present invention is one formed using Group III nitride crystal substrate, wherein the Group III nitride crystal substrate is the above-mentioned Group III nitride crystal substrate according to the present invention. The type of the semiconductor device according to the present invention is not particularly limited. The semiconductor device may be, for example, a laser diode or a light emitting diode.

The etchant of the present invention is an etchant that is a melt containing at least one of alkali metal and alkaline-earth metal. In the etchant, it is preferable that one of the following formulae is satisfied:

$0 \leq A/(A+M) \leq 0.10$ (1); and $0.9 \leq A/(A+M) \leq 0.999$ (2), more preferably:

$0 \leq A/(A+M) \leq 0.05$ (3); and $0.95 \leq A/(A+M) \leq 0.999$ (4), where "A" denotes the number of moles of the Group III element and "M" denotes the number of total moles of the alkali metal and alkaline-earth metal.

In the present invention, more preferably, a Group III element identical with that contained in the Group III nitride crystals whose surfaces are to be treated is added to the etchant. For instance, when the surface of a GaN, InN, or AlN substrate is to be treated, it is preferable that the etchant contains Ga, In, or Al, respectively. In the case of using an etchant containing Al, since temperature of the etchant may become high in some cases, it is preferable that at least one of Ga and In is added to the etchant together with Al.

In the present invention, it is preferable that the etchant is an etchant containing Na and Ga.

In the present invention, it is preferable that the etchant further includes polishing grains. Examples of the polishing grains include alumina, diamond, SiC, GaN and AlN. The polishing grains have diameters of, for instance, 0.01 µm to 2 µm, preferably 0.05 µm to 0.5 µm.

Next, embodiments of the present invention are described.

Embodiment 1

Embodiment 1 is directed to a manufacturing method including: a process of mechanically processing the surface of a Group III nitride crystal substrate including a semiconductor seed layer, a first semiconductor layer, and a second semiconductor layer; and an processing process that is carried out through meltback etching by bringing the surface processed mechanically into contact with a melt containing at least one of alkali metal and alkaline-earth metal.

First, a semiconductor seed layer (expressed by a composition formula of $Al_sGa_tIn_{1-s-t}N$ (where $0 \leq s \leq 1$, $0 \leq t \leq 1$, and $s+t \leq 1$)) to serve as seed crystals is grown on a base substrate by, for instance, the vapor phase growth method such as the MOCVD.

Next, a first semiconductor layer that is expressed by a composition formula of $Al_mGa_nIn_{1-m-n}N$ (where $0 \leq m \leq 1$, $0 \leq n \leq 1$, and $m+n \leq 1$) is grown through liquid phase growth on the semiconductor seed layer. Further, a second semiconductor layer that is expressed by a composition formula of $Al_xGa_yIn_{1-x-y}N$ (where $0 \leq x \leq 1$, $0 \leq y \leq 1$, and $x+y \leq 1$) is grown thereon through the liquid phase growth.

The following description is directed to an example of the method of forming the first and second semiconductor layers through the liquid phase growth.

First, in an atmosphere (preferably a pressurized atmosphere of 100 atm ($100 \times 1.013 \times 10^5$ Pa) or lower) including nitrogen, the surface of the semiconductor seed layer is brought into contact with a melt containing at least one Group III element selected from Ga, Al, and In, at least one of alkali metal and alkaline-earth metal, and nitrogen. Consequently, the surface of the semiconductor seed layer is melted back and then the first semiconductor layer (the high defect layer) having a higher dislocation density than that of the semiconductor seed layer is grown thereon. This first semiconductor layer (the high defect layer) tends to take in alkali metal or alkaline-earth metal that is used as a flux for the liquid phase growth and also may take in the Group III element not as a nitride but as a metal element. The first semiconductor layer has a dislocation density of, for instance, at least $10^8$ cm$^{-2}$, preferably $10^9$ cm$^{-2}$ to $10^{14}$ cm$^{-2}$. The first semiconductor layer has a higher dislocation density when compared to the second semiconductor layer.

Next, the second semiconductor layer is grown subsequent to the growth of the first semiconductor layer. That is, in the state where the semiconductor seed layer is in contact with the melt (in the same atmosphere), the first and second semiconductor layers can be formed in a series of processes. Specifically, in the atmosphere (preferably a pressurized atmosphere of 100 atm ($100 \times 1.013 \times 10^5$ Pa) or lower) including nitrogen, for instance, the first semiconductor layer can be formed by using an unsaturated melt first and then bringing the melt into a supersaturation state. Subsequently, crystal growth is carried out using the supersaturated melt and thereby the second semiconductor layer can be formed. In this case, the semiconductor seed layer that has been brought into contact with the unsaturated melt is melted and thereby the first semiconductor layer with a high dislocation density is formed. The thickness of the first semiconductor layer is not particularly limited but can be, for example, 1 μm to 200 μm. In addition, the second semiconductor layer with a low dislocation density is formed on the first semiconductor layer that is in contact with the supersaturated melt.

As described above, when the first semiconductor layer that is a high defect layer is formed first and then the second semiconductor layer is formed thereon, the second semiconductor layer can have a lower dislocation density than that of the first semiconductor layer. The dislocation density of the second semiconductor layer is, for instance, $1 \times 10^6$ cm$^{-2}$ or lower. The density of impurities such as alkali metal can be, for example, 1 ppm to 10 ppm or lower. In this connection, it is not always necessary to form the first semiconductor layer in order to form the second semiconductor layer with a low dislocation density. It also is possible to form the second semiconductor layer with a low dislocation density by, for example, using a substrate with a relatively high dislocation density as the substrate to serve as seed crystals and growing the second semiconductor layer without melting back the substrate.

In the liquid phase growth, the atmosphere including nitrogen can be an atmosphere including, for example, $N_2$ gas or $NH_3$ gas. The alkali metal can be at least one selected from Na, Li, K, Rb, and Cs or a mixture thereof. The melt may be alkaline-earth metal alone or a mixture of alkali metal and alkaline-earth metal. The alkaline-earth metal can be at least one selected from, for example, Ca, Mg, Sr, Ba, and Be, or a mixture thereof. Usually, they work as a flux. Besides the alkali metal and alkaline-earth metal, Group III elements also work as a flux. Furthermore, the nitrogen is being dissolved in a mixed melt of a Group III element and at least one of the alkali metal and alkaline-earth metal.

In the process of liquid phase growth, the melt can be prepared, for example, by putting a material into a crucible and then heating it. After the melt is prepared, it is brought into a supersaturation state to grow semiconductor crystals. The melting of the material and the crystal growth can be carried out, for instance, at a temperature of 700° C. to 1100° C. and a pressure of 10 atm ($10 \times 1.013 \times 10^5$ Pa) to 100 atm ($100 \times 1.013 \times 10^5$ Pa).

In the state immediately after the crystal growth (as-grown), the Group III nitride crystal substrate thus obtained has concavities and convexities (for instance, pits, hillocks and facets) formed on its surface. The orientation of the concavities and convexities is different from that of the semiconductor seed layer to serve as seed crystals. The concavities and convexities have sizes of, for instance, ±10 μm to ± several tens of micrometers and their sizes occasionally may reach the order of millimeters. Hence, when no processing process is carried out beforehand, it is difficult to carry out the exposure process for forming a device pattern or the like without causing any problems in producing a device using the substrate. It therefore is necessary to process the surface of the second semiconductor layer.

The following description is directed to an example of the method of processing the surface by meltback etching.

First, at least one of alkali metal and alkaline-earth metal may be put in a crucible and then the crucible may be heated in an electric furnace. Thus, a melt is prepared. The surfaces of nitride crystals are brought into contact with the melt and thereby are subjected to meltback etching. Examples of the ambient gas to be used in the etching include $N_2$ gas, $NH_3$ gas, and $H_2$ gas. Examples of the alkali metal include Li, Na, K, Rb, and Cs while examples of the alkaline-earth metal include Ca, Sr, Ba, and Be. One of them or two or more of them may be used. The melt may contain a Group III element. The addition of the Group III element adjusts the unsaturation degree of the melt to allow the etching rate to be adjusted. In this case, the alkali metal and alkaline-earth metal work as an etchant (a flux) that increases the etching rate. In the etchant (melt), it is preferable that, one of the following formulae is satisfied:

$$0 \leq A/(A+M) \leq 0.10 \quad (1); \text{ and}$$

$$0.9 \leq A/(A+M) \leq 0.999 \quad (2),$$

more preferably:

$$0 \leq A/(A+M) \leq 0.05 \quad (3); \text{ and}$$

$$0.95 \leq A/(A+M) \leq 0.999 \quad (4),$$

where "A" denotes the number of moles of the Group III element and "M" denotes the number of total moles of the alkali metal and alkaline-earth metal.

Preferably, the melt has a temperature of, for example, 400° C. to 900° C. and the atmosphere has a pressure of, for example, 1 atm ($1 \times 1.013 \times 10^5$ Pa) to 10 atm ($10 \times 1.013 \times 10^5$ Pa). This is because when the pressure is lower than 1 atm ($1 \times 1.013 \times 10^5$ Pa), it is difficult to prevent the alkali metal or the like to be used as a flux from vaporizing while when the pressure exceeds 10 atm ($10 \times 1.013 \times 10^5$ Pa), there is a possibility that crystals start growing in the melt.

In this embodiment, crystals obtained through the liquid phase growth were used. However, when using the meltback etching that is carried out using the melt containing at least one of alkali metal and alkaline-earth metal of the present invention, not only the crystals obtained through the liquid phase growth but also crystals obtained through the vapor phase growth can be processed to have surfaces with high flatness.

Embodiment 2

Embodiment 2 is directed to an example of carrying out a surface treatment using the mechanochemical polishing of the present invention instead of the meltback etching of Embodiment 1.

A melt including at least one of alkali metal and alkaline-earth metal is prepared in the same manner as in the case of the meltback etching of Embodiment 1. Preferably, the melt includes a Group III element. It also is preferable that in the composition of the melt, for instance, one of the following formulae is satisfied:

$$0 \leq A/(A+M) \leq 0.10 \quad (1); \text{ and}$$

$$0.9 \leq A/(A+M) \leq 0.999 \quad (2),$$

where "A" denotes the number of moles of the Group III element and "M" denotes the number of total moles of the alkali metal and alkaline-earth metal.

Such compositions allow the mechanochemical polishing of the present invention to be carried out at still lower temperatures. Polishing grains to be used herein are, for instance, alumina, diamond, or SiC that is relatively hard and has low reactivity with alkali metal and the like. In addition, further examples of the polishing grains to be used herein include polishing grains whose hardness is about the same as that of Group III nitride crystals of, for instance, GaN and AlN to be subjected to the surface treatment, and polishing grains having the same composition as that of the Group III nitride crystals. Preferably, the mechanochemical polishing of the present invention is carried out in an atmosphere (for instance, in a glove box) that had been subjected to, for instance, N₂ gas or rare gas substitution, because of the high reactivity with oxygen and water contained in the melt to be used. The abrasive cloth can be one of those known conventionally. Among them, those having low reactivity with alkali metal and alkaline-earth metal are preferable. Furthermore, conventionally known polishing apparatuses can be used. The presence of oxygen or water causes the alkali metal or alkaline-earth metal to exist not as metal but as oxides or hydroxides. This may prevent the etching effect originally expected from being exhibited. As a result, it may become difficult to obtain a satisfactory effect of the surface treatment in some cases. A lower treatment temperature is preferable. For instance, in order to reduce viscosity of the melt, the treatment temperature is preferably in the range of 80° C. to 200° C. but is not limited thereto. When using a Na-Li or Na-Ga melt and diamond polishing grains, GaN crystals that include no damaged layer and have high surface flatness can be obtained, for instance, at a rate of 0.05 μm to 1 μm per 10 minutes.

Embodiment 3

Embodiment 3 is directed to an example of the method of manufacturing a Group III nitride crystal substrate, which further includes, in addition to the processes of Embodiment 1, a process of removing at least the semiconductor seed layer and the first semiconductor layer from the base substrate side.

As in Embodiment 1, when a first semiconductor layer that is a high defect layer is formed between a semiconductor seed layer to serve as seed crystals and a second semiconductor layer that is a low defect layer, the high defect layer often has a considerably different carrier density and contains a large amount of impurities. Hence, it may be preferable that the high defect layer is removed when a device is to be produced using the substrate. The reason for this is as follows. That is, particularly in the case of, for example, a semiconductor laser, electrodes may be formed on the rear face of the substrate and in that case, the presence of the part that is considerably different in carrier density and amount of defects (including amount of impurities) from the rest may deteriorate device performance and reliability. Hence, it is advantageous to remove at least the semiconductor seed layer and the first semiconductor layer from the base substrate side, and preferably a part of the second semiconductor layer together with them. The method of removing them is not particularly limited but examples thereof may include mechanical grinding, various types of grinding, and meltback etching.

Furthermore, the surface of the second semiconductor layer that is exposed by the removal of the layers described above may be brought into contact with a melt containing at least one of alkali metal and alkaline-earth metal to be subjected to meltback etching or mechanochemical polishing.

In the Group III nitride crystal substrate of the present invention, its surface hardly has concavities and convexities such as, for example, facets, pits and hillocks and therefore is flat, and the surface also has fewer grinding damages and less strain caused through the processing. Accordingly, the Group III nitride crystal substrate of the present invention allows a semiconductor device of higher performance to be formed. That is, a semiconductor device such as, for instance, a laser diode or a transistor can be produced on the Group III nitride crystal substrate of the present invention.

Embodiment 4

Embodiment 4 is directed to an example of the method of processing the surface of a Group III nitride crystal substrate grown through the vapor phase growth, by meltback etching.

When a semiconductor layer that is expressed by a composition formula of $Al_sGa_tIn_{1-s-t}N$ (where $0 \leq s \leq 1$, $0 \leq t \leq 1$, and $s+t \leq 1$) is grown on a base substrate by the vapor phase growth method, the substrate has relatively large concavities and convexities formed of, for instance, hillocks and pits at its surface in the state immediately after the crystal growth (as-grown). In the case of the Group III nitride crystal substrate grown from the vapor phase growth, however, since strain and defects that are caused through the processing cannot be eliminated by common polishing alone, it usually is used, in the state immediately after the crystal growth (as-grown), as a substrate to be employed for device production. In this case, however, the concavities and convexities formed at the substrate surface cause problems in, for instance, an exposure process that is carried out in producing a device using the substrate later as in the case of the crystal substrate grown through the liquid phase growth. Hence, it is necessary to process the crystal surfaces to allow the surfaces to have concavities and convexities of, for instance, ±5 μm or smaller. In the case of crystals grown through the vapor phase growth, meltback etching of the present invention, both the common mechanochemical polishing and the meltback etching of the present invention, or the mechanochemical polishing of the present invention can be employed to eliminate strain and defects caused through the processing and thus to flatten the crystal surfaces.

Embodiment 5

Embodiment 5 is directed to an example of processing a wafer-like Group III nitride crystal substrate by subjecting bulk crystals to slice processing.

First, bulk crystals obtained through the liquid phase growth or the vapor phase growth, are subjected to slice processing and thereby a wafer-like Group III nitride crystal substrate is obtained. Examples of the liquid phase growth include the melt growth, the Flux growth, the LPE growth and the Czochralski growth. Examples of the vapor phase growth include the HVPE growth and the sublimation growth. The substrate surface exposed by the slice processing becomes a very rough surface by slicing. Hence, the substrate surface is subjected to mirror-finish processing that is carried out by polishing or grinding, which is mechanical processing. After the mirror-finish processing, a damaged layer formed by the mechanical processing is eliminated by meltback etching or both common mechanochemical polishing and meltback etching of the present invention and thereby a Group III nitride crystal substrate with higher flatness can be obtained.

Embodiment 6

Figure 8:
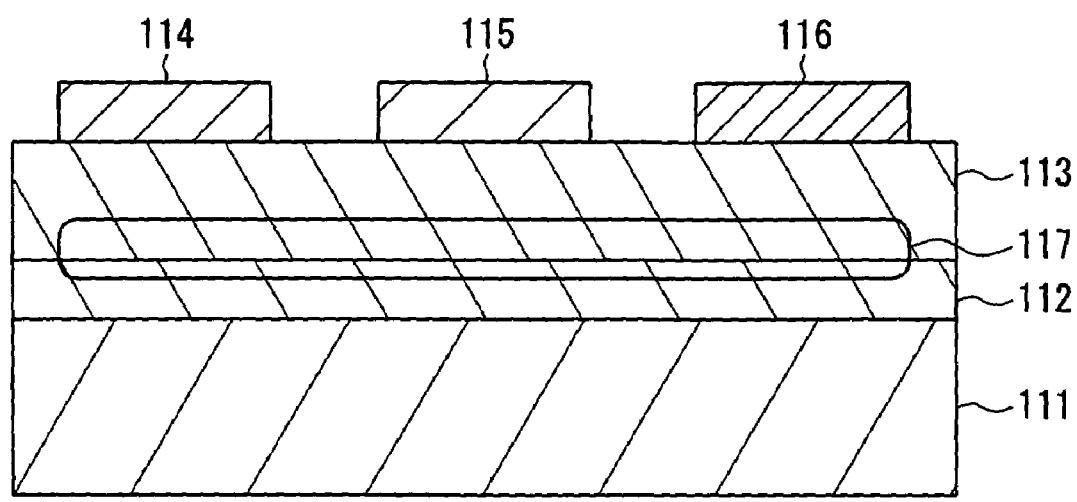
FIG. 8 is a cross-sectional view showing the configuration of another example of semiconductor devices according to the present invention.

The following description is directed to an example of producing a field effect transistor (FET). FIG. 8 schematically shows the configuration of a FET. An undoped GaN substrate 111 can be used for the substrate. The GaN substrate 111 can be obtained through the liquid phase growth using a flux. The GaN substrate 111 obtained through the liquid phase growth has an electrical resistance of, for instance, at least $10^{10}$ Ω and therefore has characteristics similar to those of an insulator. A GaN layer 112 and an AlGaN layer 113 are formed sequentially on the GaN substrate 111 by the MOCVD method. Furthermore, a source electrode 114, a gate electrode 115, and a drain electrode 116 are formed on the AlGaN layer 113. Voltage is applied to the gate electrode 115 and thereby the concentration of two-dimensional electron gas 117 that is generated at the interface between the GaN layer 112 and the AlGaN layer 113 is controlled. Thus the operation as a transistor is carried out. Especially, the use of meltback etching of the present invention, the mechanochemical polishing of the present invention and both the common mechanochemical polishing and the meltback etching of the present invention allows the substrate 111 to have a reduced number of surface defects and reduced strain caused through the processing. As a result, the GaN layer 112 and the AlGaN layer 113 that each have a low dislocation density can be formed by the MOCVD. Thus, it is possible to obtain a FET that has a high insulation property and an excellent high frequency property and allows the leakage current that is caused during the operation of the transistor to be reduced.

Hereinafter, the present invention is described further in detail using examples.

EXAMPLE 1

Example 1 is an example in which a semiconductor seed layer to serve as seed crystals is formed on a base substrate and then the surface that is the surface of a first semiconductor layer grown on the semiconductor seed layer through liquid phase growth and has concavities and convexities formed of, for instance, facets and pits is processed by common mechanochemical polishing. This example is described below with reference to FIGS. 2A and 2B.

Figure 2A:
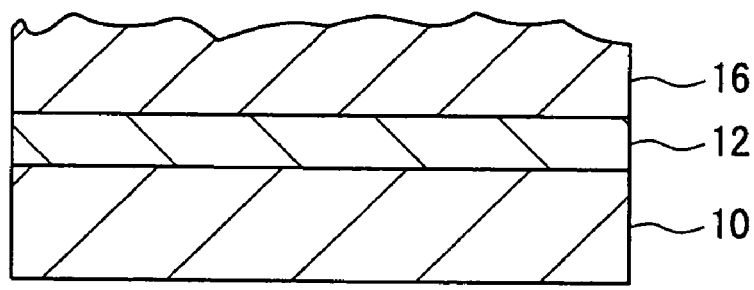
FIGS. 2A and 2B are drawings showing a process of a further example of the manufacturing method according to the present invention.
Figure 2B:
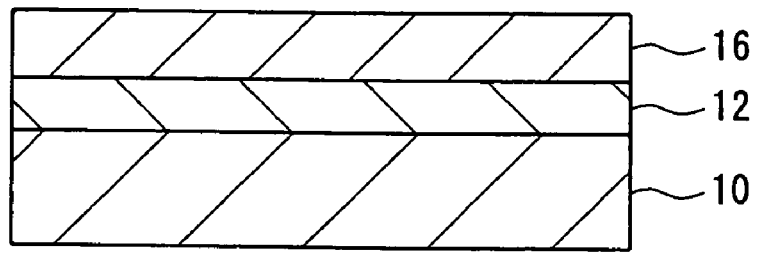

FIGS. 2A and 2B are cross-sectional views showing an example of the process of processing the surface of a Group III nitride crystal substrate. As shown in FIG. 2A, a GaN film (with a thickness of 4 µm) was formed as a semiconductor seed layer 12 on a base substrate 10 by the MOCVD method. Specifically, a sapphire substrate whose surface was a C plane was used for the base substrate 10 and was heated to a temperature of 1020° C. to 1100° C., and then trimethylgallium (TMG) and $NH_3$ were supplied onto the base substrate 10.

Subsequently, a first semiconductor layer 16 was grown on the semiconductor seed layer 12 through liquid phase growth. Specifically, in a nitrogen atmosphere (preferably a pressurized atmosphere of 100 atm ($100 \times 1.013 \times 10^5$ Pa) or lower), the semiconductor seed layer 12 was brought into contact with a melt including gallium, sodium, and nitrogen, and thereby a GaN layer (the first semiconductor layer) 16 was grown on the semiconductor seed layer 12. Thus, a Group III nitride crystal substrate including the semiconductor seed layer 12 and the first semiconductor layer 16 formed sequentially on the base substrate 10 was obtained.

The surface of the Group III nitride crystal substrate thus obtained was observed visually and with Optical Microscope. As a result, concavities and convexities formed of, for instance, facets, pits and hillocks were found.

Next, the surface of the Group III nitride crystal substrate obtained above was subjected to mechanical processing that was carried out using abrasive grains of, for instance, diamond, SiC, or alumina. Thus, the surface was processed. Thereafter, using a $SiO_2$ slurry and abrasive cloth, the processed surface was subjected to the common mechanochemical polishing and thereby the strain of the surface caused by the processing was eliminated. Thus, a Group III nitride crystal substrate with a flat and mirror-smooth surface was obtained. The concavities and convexities of the surface of the Group III nitride crystal substrate was measured by optical interferometer and obtained above had sizes of ±4 µm or smaller. In addition, the surface roughness was measured by AFM and then the root mean square (RMS) thereof was calculated and as a result, was about 2 nm.

The PL intensity of the surface of the Group III nitride crystal substrate was measured immediately after the crystal growth (as-grown) and after the common mechanochemical polishing process (using a HeCd laser (325 nm)). As a result, the ratio ($PL_a/PL_b$) of the PL intensity ($PL_a$) obtained after the common mechanochemical polishing process to that ($PL_b$) obtained immediately after the crystal growth (as-grown) was 0.5 to 1, and thus it was proved that the strain caused through the processing was suppressed to a relatively small degree. In this case, the use of the common mechanochemical polishing alone allowed the damaged layer to have a reduced thickness without using meltback etching. Conceivably, this is because crystals grown through the liquid phase growth are harder and denser.

In order to further reduce the strain caused through the processing carried out by common mechanochemical polishing and to improve repeatability, meltback etching of the present invention was effective.

EXAMPLE 2

Example 2 is an example in which under the same conditions as in Example 1, a Group III nitride crystal substrate was grown into a bulk, which then was sliced to give wafer substrates, and then their surfaces were flattened by common mechanochemical polishing and meltback etching of the present invention.

Figure 3A:
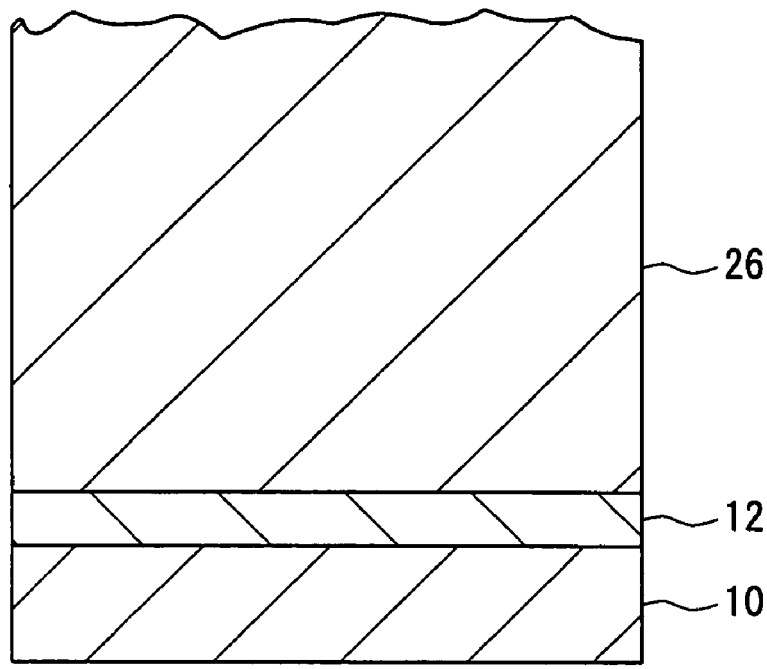
FIGS. 3A and 3B are drawings showing a process of another example of the manufacturing method according to the present invention.
Figure 3B:
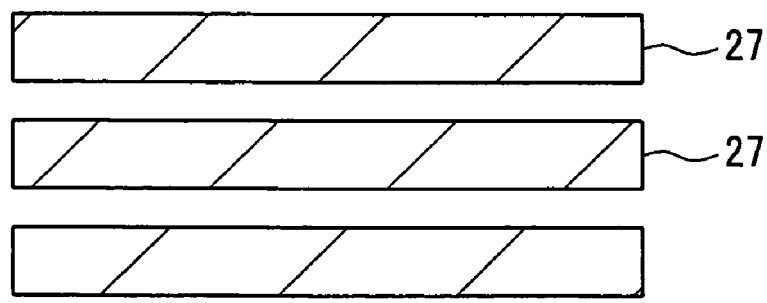

FIGS. 3A and 3B are cross-sectional views showing an example of the process of manufacturing wafer substrates by slicing a Group III nitride crystal substrate. First, a 5-mm thick GaN layer (a first semiconductor layer) 26 was grown on a semiconductor seed layer in the same manner as in Example 1. Thereafter, the first semiconductor layer 26 was sliced to give wafer substrates 27 with a thickness of 300 µm. The slice cut surfaces of the substrates 27 were rough surfaces with larger concavities and convexities than those observed immediately after crystal growth.

Next, the surface of each substrate 27 was subjected to mechanical processing that was carried out using abrasive grains of, for instance, diamond, SiC, or alumina. Thus, the surface was flattened substantially. Thereafter, a damaged layer formed at the surface of the substrate 27 through the mechanical processing was removed by common mechanochemical polishing and meltback etching of the present invention. The common mechanochemical polishing was carried out in the same manner as in Example 1.

The method of the meltback etching of the present invention is described below.

Figure 6:
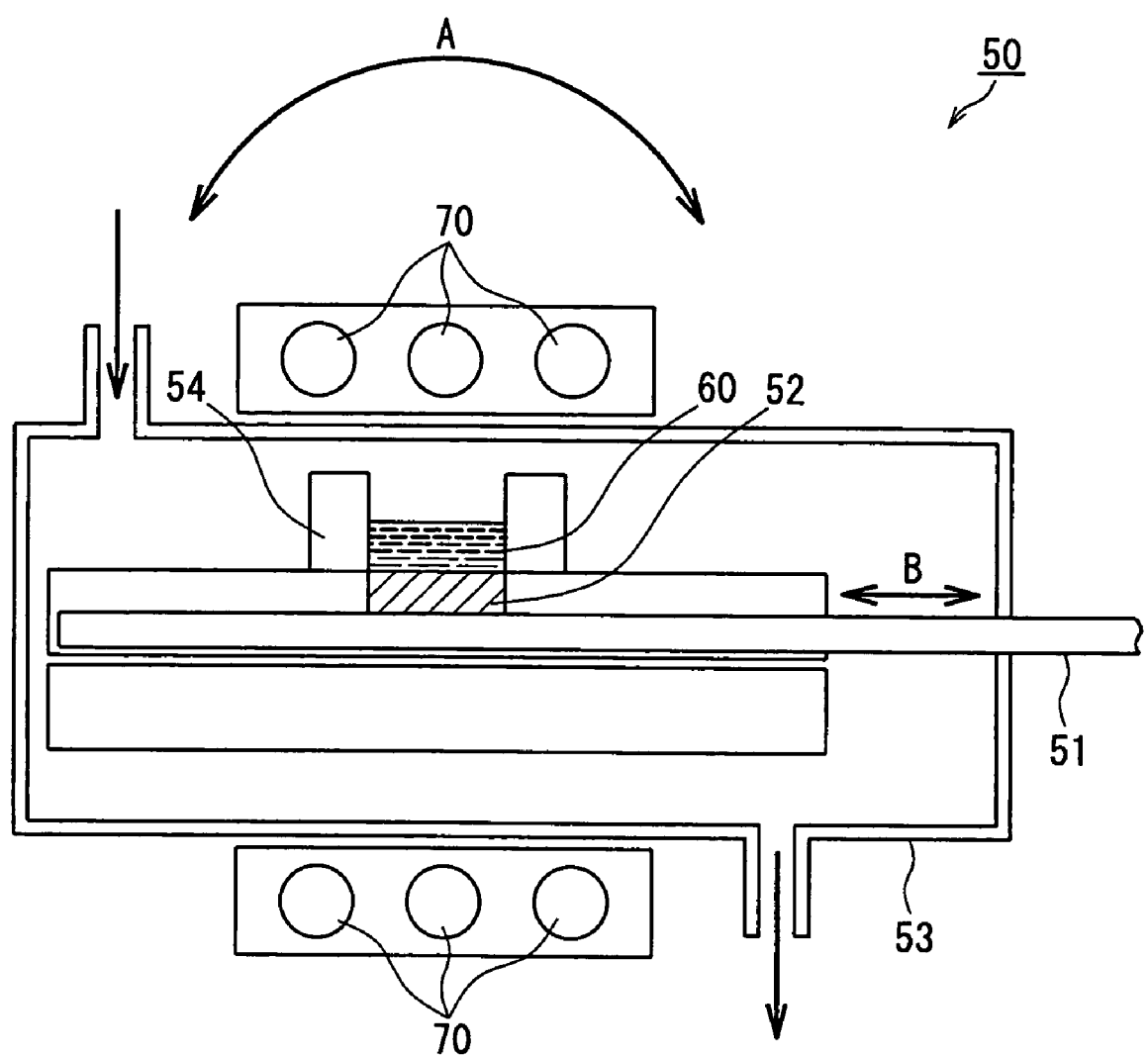
FIG. 6 is a drawing showing the configuration of an example of the manufacturing apparatus to be used in the manufacturing method of the present invention.

The crystal surface was subjected to meltback etching of the present invention using an etchant of the present invention that is a melt containing alkali metal. FIG. 6 shows an etching unit to be used in this example.

The etching unit 50 shown in FIG. 6 includes an electric furnace 53 and a heater 70. A slider 51 on which a nitride substrate 52 is placed and a crucible 54 are disposed inside the electric furnace 53. An etchant 60 that is an unsaturated melt is put in the crucible 54. Nitrogen gas was used as the ambient gas and a melt (a flux) was used as the etchant. The melt contained Ga that was added thereto so as to account for 0 to 10 mol %, with alkali metal (Na or Na—Li) being taken as 100. As in this case, when Ga is added to adjust the unsaturation degree, it is possible to obtain a Group III nitride crystal substrate with a surface that has less strain caused through the processing and has high flatness. In this case, the following conditions were employed for meltback etching. That is, the temperature of the etchant was in the range of 600° C. to 900° C. while the nitrogen pressure was in the range of 1 atm ($1\times1.013\times10^5$ Pa) to 5 atm ($5\times1.013\times10^5$ Pa). Under these conditions, the slider 51 was moved in the directions indicated with the arrow B in FIG. 6 and then the Group III nitride crystal substrate 52 was moved to a low-temperature area inside the electric furnace 53. Thus, etching was stopped. In order to improve the repeatability of etching, as show with the arrow A in FIG. 6, the crucible 54 containing the etchant 60 therein was rocked at an angle of, for instance, ±20° together with the whole electric furnace 53. This allows nitrogen gas to dissolve uniformly in the etchant and thereby allows the entire etchant to have a uniform unsaturation degree.

According to the method of the present invention, the etching rate can be, for example, 0.05 μm/min to 0.5 μm/min. With such a high rate, the concavities and convexities of the surface of the Group III nitride crystal substrate were reduced in size to, for instance, ±5 μm or smaller (which denotes a substantially mirror-smooth state). In this connection, a document (Solid-state Electronics. Vol. 41, No. 2, pp. 295–298 (1997)) describes a method of etching that is carried out using a solution of Ga whose ratio is 100%. In the present invention, however, a melt containing alkali metal and the like is used as the etchant. Consequently, the surface of the Group III nitride crystal substrate can be brought into a substantially mirror-smooth state at an etching rate that is about several times to several tens of times higher than the rate described in the document.

As described above, the method using both the common mechanochemical polishing and the meltback etching of the present invention may be applied to the rear face of the substrate and all the crystal surfaces including the slice cut surface. The Group III nitride crystal substrate obtained in the manner described above had a flat surface and fewer defects. Accordingly, when a semiconductor laser or an electronic device was produced using the substrate, the device characteristics improved including, for instance, reductions in diffusion of the flux into the manufacturing apparatus and in leakage current. In the present example, the first semiconductor layer grown as described above was thick. However, it also is possible to use a substrate that is produced by growing a thin first semiconductor layer and a thick second semiconductor layer whose thickness is about several millimeters as described in Example 3 below.

EXAMPLE 3

Example 3 is an example of processing, by common mechanochemical polishing, the surface of a Group III nitride crystal substrate including a semiconductor seed layer, a first semiconductor layer, and a second semiconductor layer that are formed sequentially on a base substrate. The first semiconductor layer and the second semiconductor layer are grown through liquid phase growth.

Figure 4A:
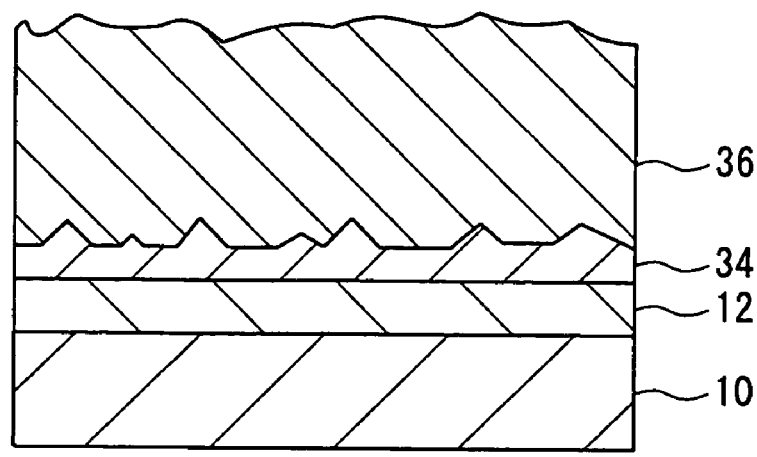
FIGS. 4A and 4B are drawings showing a process of still another example of the manufacturing method according to the present invention.
Figure 4B:
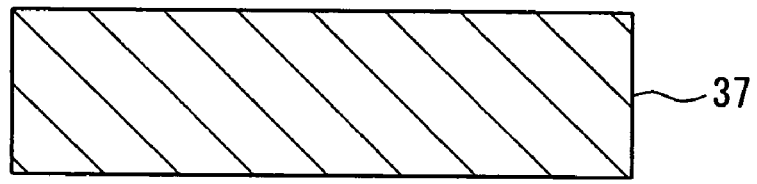

This example is described below with reference to FIGS. 4A and 4B. FIGS. 4A and 4B are cross-sectional views showing an example of the process of processing, by common mechanochemical polishing, the surface of a Group III nitride crystal substrate including three semiconductor layers formed on a substrate.

First, a semiconductor seed layer 12 was formed on a base substrate 10 in the same manner as in Example 1. Subsequently, a high defect layer (the first semiconductor layer) 34 and a LPE layer (the second semiconductor layer) 36 were formed sequentially on the semiconductor seed layer 12, in a GaN melt. Specifically, in a nitrogen atmosphere (preferably a pressurized atmosphere of 100 atm ($100\times1.013\times10^5$ Pa) or lower), the surface of the semiconductor seed layer 12 was brought into contact with a melt including gallium, sodium, and nitrogen, and thereby the high defect layer 34 and the LPE layer 36 were grown. In this case, they can be formed by, for example, the following methods. That is, the temperature of the melt is raised to a higher temperature than the growth temperature that allows the LPE layer 36 to grow and then is lowered to the growth temperature. In another method, the pressure of the nitrogen gas that is an ambient gas is set at a lower pressure than that required for the growth of the LPE layer 36 and then is increased. In other words, the seed layer is melted using an unsaturated melt and then the melt is brought into a supersaturation state to grow the GaN layer. Thus, the high defect layer 34 can be formed. Subsequently, the melt is kept supersaturated continuously and thereby the LPE layer 36 is grown on the high defect layer 34. This allowed the LPE layer with a low dislocation density to grow readily.

Next, the base substrate 10, the semiconductor seed layer 12, the first semiconductor layer (the high defect layer) 34, and a part of the second semiconductor layer (the LPE layer) 36 were removed by diamond grinding. Thus, a Group III nitride crystal substrate 37 of high quality was obtained. The high defect layer 34 takes in a large amount of Na that is a component of the flux used in the LPE growth and has a high defect density. Hence, the high defect layer 34 often may have a considerably different carrier density and may contain impurities. In this case, particularly in a laser device with a configuration in which electrodes are formed on the rear face, electrode characteristics may be unsteady or leakage current may increase in some cases. Accordingly, it is preferable that the first semiconductor layer (the high defect layer) 34 is removed.

Subsequently, in order to flatten the crystal growth face (i.e. the surface located opposite to the surface subjected to the diamond grinding) of the Group III nitride crystal substrate 37, mechanical processing was carried out using SiC abrasive grains. Thereafter, using $SiO_2$ (with a grain size of 0.05 μm) as polishing grains, common mechanochemical polishing was carried out in the same manner as in Example 1. Thus, a Group III nitride crystal substrate was obtained in which the crystal growth face was a mirror-smooth surface.

The surface of the Group III nitride crystal substrate thus obtained had fewer scratches and was in a mirror-smooth state. The concavities and convexities of the substrate surface had sizes of ±3 μm or smaller. Furthermore, the PL intensity was measured immediately after crystal growth (as-grown) and after the common mechanochemical polishing process. As a result, the ratio ($PL_a/PL_b$) of the PL intensity ($PL_a$) obtained after the common mechanochemical polishing process to that ($PL_b$) obtained immediately after the crystal growth (as-grown) was 0.5 to 1, and it was proved that the strain caused through the processing was suppressed to a small degree. In this case, the use of the common mechanochemical polishing alone allowed the damaged layer to have a small thickness without using meltback etching. Conceivably, this is because crystals grown through liquid phase growth are harder and denser.

EXAMPLE 4

Example 4 is an example of processing, by common mechanochemical polishing and meltback etching of the present invention, the surface of a Group III nitride crystal substrate grown through vapor phase growth. This example is described below with reference to FIGS. 5A and 5B.

Figure 5A:
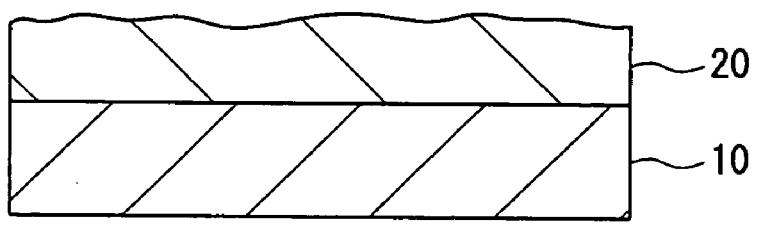
FIGS. 5A and 5B are drawings showing a process of yet another example of the manufacturing method according to the present invention.
Figure 5B:
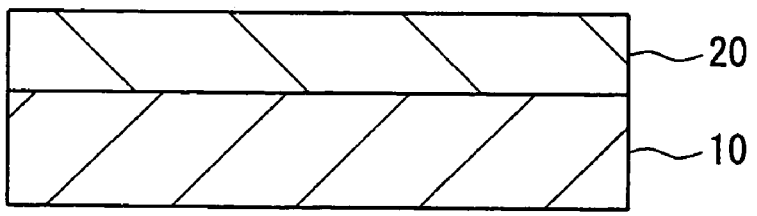

FIGS. 5A and 5b are cross-sectional views showing an example of the process of processing the surface of a Group III nitride crystal substrate by common mechanochemical polishing and meltback etching of the present invention. As shown in FIG. 5A, a sapphire substrate whose surface was a (0001) plane was used as a base substrate 10. Group III nitride crystals (a seed layer) with a thickness of 8 μm were grown on the base substrate 10 by the MOCVD. Further, Group III nitride crystals 20 (with a thickness of 30 μm) were grown thereon by the HVPE. In the state immediately after the crystal growth (as-grown), concavities and convexities formed of hillocks at the surface were observed visually. In addition, many pits were found through microscopic observation.

The Group III nitride crystal substrate described above was subjected to the common mechanochemical polishing. For the common mechanochemical polishing, a $SiO_2$ slurry and abrasive cloth were used. As a result, many scratches were observed at the surface of the Group III nitride crystal substrate. Furthermore, the PL intensity was measured immediately after the crystal growth (as-grown) and after the common mechanochemical polishing process. As a result, the ratio ($PL_d/PL_b$) of the PL intensity ($PL_a$) obtained after the common mechanochemical polishing process to that ($PL_b$) obtained immediately after the crystal growth (as-grown), which serves as an index of strain caused through the processing, was 0.1 to 0.3. The substrate did not fully return to the state obtained immediately after crystal growth. The strain caused through the processing was not eliminated satisfactorily. As distinct from Example 1, the strain and defects caused through the processing was not eliminated by the common mechanochemical polishing alone. Presumably, this is because the method of manufacturing the crystals employed in this case was different from that employed in Example 1, although the details are not clear. That is, conceivably, since the crystals to be grown through vapor phase growth are grown at a higher growth rate in general and thus include a lot of crystal defects, the common mechanochemical polishing alone cannot eliminate the strain and defects caused through the processing satisfactorily.

Subsequently, the substrate subjected to common mechanochemical polishing was subjected to meltback etching of the present invention. The meltback etching of the present invention was carried out the same manner as in Example 2. According to the method of present invention, the etching rate can be, for example, 0.05 μm/min to 0.5 μm/min. With such a high rate, the concavities and convexities of the surface of the Group III nitride crystal substrate 20 were reduced in size to, for instance, ±5 μm or smaller (which denotes a substantially mirror-smooth state). In this connection, the document (Solid-state Electronics. Vol. 41, No. 2, pp. 295–298 (1997)) describes the method of etching that is carried out using a solution of Ga whose ratio is 100%. In the present invention, however, the surface of the Group III nitride crystal substrate can be brought into a substantially mirror-smooth state at an etching rate that is about several times to several tens of times higher than the rate described in the non-patent document 1.

The PL intensity of the surface of the Group III nitride crystal substrate obtained above was measured. As a result, the ratio ($PL_d/PL_b$) of the PL intensity ($PL_a$) obtained after the meltback etching process to that ($PL_b$) obtained immediately after the crystal growth (as-grown) was 0.5 to 1. Thus, it can be considered that most of the strain caused through the processing was eliminated. Furthermore, since the concavities and convexities of the surface had sizes of about ±5 μm, the substrate has high surface flatness. Accordingly, the substrate can be used for semiconductor devices and the like.

From the results described above, meltback etching of the present invention makes it possible to obtain a Group III nitride crystal substrate having reduced strain and defects that are caused through the processing and high surface flatness. Hence, the meltback etching of the present invention is ideal for the surface finish.

EXAMPLE 5

Example 5 is an example of processing, by common mechanochemical polishing and meltback etching, the surface of a bulk substrate formed of Group III nitride crystals grown through vapor phase growth. This example is described below with reference to FIGS. 1A and 1B.

Figure 1B:
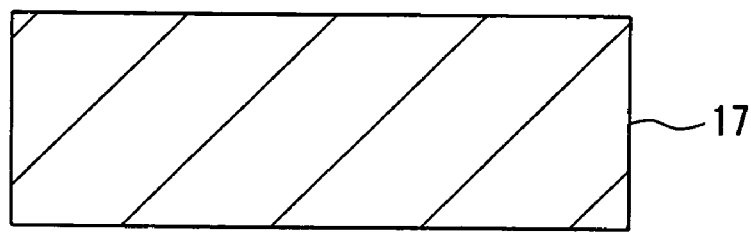

FIGS. 1A and 1B are cross-sectional views showing an example of the process of processing the surface of a Group III nitride crystal substrate by common mechanochemical polishing and meltback etching of the present invention. As shown in FIG. 1A, a free-standing bulk substrate 11 (with a thickness of 300 μm) that was obtained through the HVPE and had scratches at its surface was subjected to common mechanochemical polishing first. The common mechanochemical polishing was carried out in the same manner as in Example 1. Next, meltback etching was carried out using the same etchant as that used in Example 4 to process the surface as shown in FIG. 1B. Thus, a free-standing Group III nitride crystal semiconductor substrate 17 was obtained. The following conditions were employed for the meltback etching. That is, the temperature of the etchant was in the range of 700° C. to 800° C., nitrogen gas was used as the ambient gas, and the nitrogen pressure was in the range of 1 atm ($1 \times 1.013 \times 10^5$ Pa) to 5 atm ($5 \times 1.013 \times 10^5$ Pa). Under such conditions, the etching was carried out for 10 minutes, and the portion of the substrate etched thereby had a thickness of 0.05 μm to 2 μm.

The sizes of concavities and convexities of the surface of the Group III nitride crystal substrate were measured after the common mechanochemical polishing as well as after the meltback etching. As a result, while the size of the concavities and convexities of the surface measured after the common mechanochemical polishing was ±3 μm, that measured after the meltback etching was slightly larger, specifically ±5 μm.

Subsequently, with respect to the surface of the Group III nitride crystal substrate, the PL intensity was measured after the common mechanochemical polishing and after the meltback etching. As a result, the ratio ($PL_B/PL_K$) of the PL intensity ($PL_B$) obtained after the meltback etching to that ($PL_K$) obtained after the common mechanochemical polishing was 1.5 to 3. Thus, it was proved that the ratio ($PL_B/PL_K$) increased.

Next, SIMS was conducted using the Group III nitride crystal substrate obtained above. As a result, it was proved that the Group III nitride crystal substrate hardly took in Na of the etchant.

From the results of the SIMS described above, the increase in the PL intensity may indicate that the strain caused through the processing, which was not eliminated by the common mechanochemical polishing, was eliminated by the meltback etching of the present invention.

From these results, the meltback etching of the present invention makes it possible to obtain a Group III nitride crystal substrate with a reduction of the strain and defects caused through the processing. Hence, the meltback etching of the present invention is ideal for the surface finish. Furthermore, in order to further reduce the strain and defects caused through the processing and improve the flatness, the mechanochemical polishing of the present invention that is carried out using a melt including at least one of alkali metal and alkaline-earth metal may be employed additionally.

EXAMPLE 6

Figure 7:
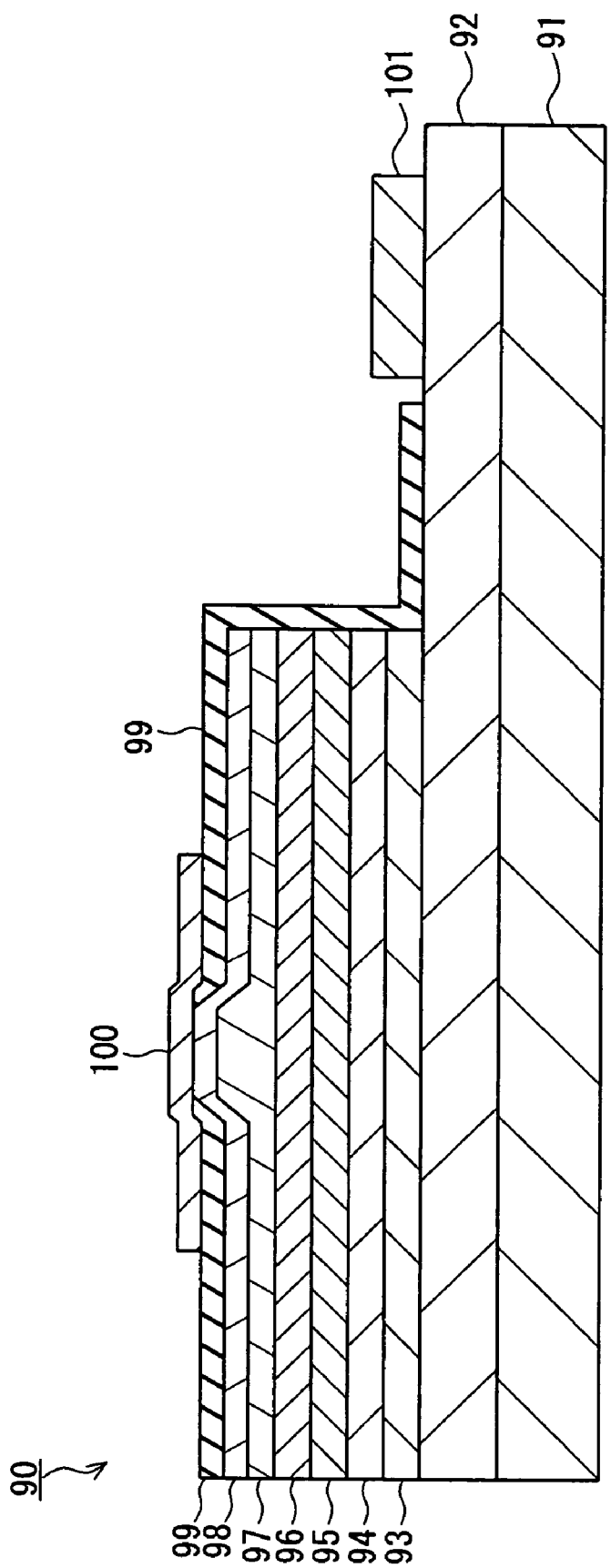
FIG. 7 is a cross-sectional view showing the configuration of an example of semiconductor devices according to the present invention.

In Example 6, a semiconductor laser was produced using the substrate obtained in the example described above. FIG. 7 shows the configuration of a semiconductor laser 90.

First, a contact layer 92 of n-type GaN doped with Si to have a carrier density of $5 \times 10^{18}$ cm$^{-3}$ or lower was formed on a substrate 91 formed of GaN crystals that was obtained in the example described above. The substrate 91 used in this example was a free-standing substrate including Group III nitride crystals formed on sapphire by the LPE method or a substrate formed of Group III nitride crystals. In this case, since the substrate formed through the LPE was relatively easy to process, common mechanochemical polishing was employed as the method of processing the substrate. Next, a cladding layer 93 of n-type $Al_{0.07}Ga_{0.93}N$ and a light guiding layer 94 of n-type GaN were formed sequentially on the contact layer 92. Subsequently, a multiple quantum well (MQW) composed of a well layer (with a thickness of about 3 nm) made of $Ga_{0.8}In_{0.2}N$ and a barrier layer (with a thickness of about 6 nm) made of GaN was formed as an active layer 95. Thereafter, a light guiding layer 96 of p-type GaN, a cladding layer 97 of p-type $Al_{0.07}Ga_{0.93}N$, and a contact layer 98 of p-type GaN were formed sequentially. These layers can be formed by well-known methods. The semiconductor laser 90 is of a double-hetero junction type. The energy gap of the well layer containing indium in the MQW active layer is smaller than those of the n-type and p-type cladding layers containing aluminum. On the other hand, the highest optical refractive index is obtained in the well layer of the active layer 95, while the light guiding layers and the cladding layers have optical refractive indices that decrease in this order.

An insulating film 99 forming a current injection region having a width of about 2 μm was formed on the contact layer 98. A ridge part to serve as a current constriction part was formed in the upper portion of the p-type cladding layer 97 and the p-type contact layer 98.

A p-side electrode 100 that was in ohmic contact with the contact layer 98 was formed on the upper side of the p-type contact layer 98. An n-side electrode 101 that was in ohmic contact with the contact layer 92 was formed on the upper side of the n-type contact layer 92.

The semiconductor laser thus produced was subjected to a device evaluation. When a predetermined forward voltage was applied between the p-side electrode and the n-side electrode of the semiconductor laser obtained in the above, positive holes and electrons were injected into the MQW active layer from the p-side electrode and the n-side electrode, respectively. The positive holes and electrons thus injected were recombined with each other in the MQW active layer to produce optical gain, and thereby the semiconductor laser generated oscillation with an emission wavelength of 404 nm. When using a crystal substrate produced through the LPE, it can be processed easily as compared to a crystal substrate grown through vapor phase growth. Hence, it was possible to reduce the number of defects of the surface of the substrate as compared to the case where the substrate produced through vapor phase growth was subjected to common mechanochemical polishing. As a result, the threshold current required for laser oscillation was reduced by about 10%. Furthermore, when meltback etching of the present invention was used as the method of processing the substrate, less variations in threshold current were observed.

Figure 9:
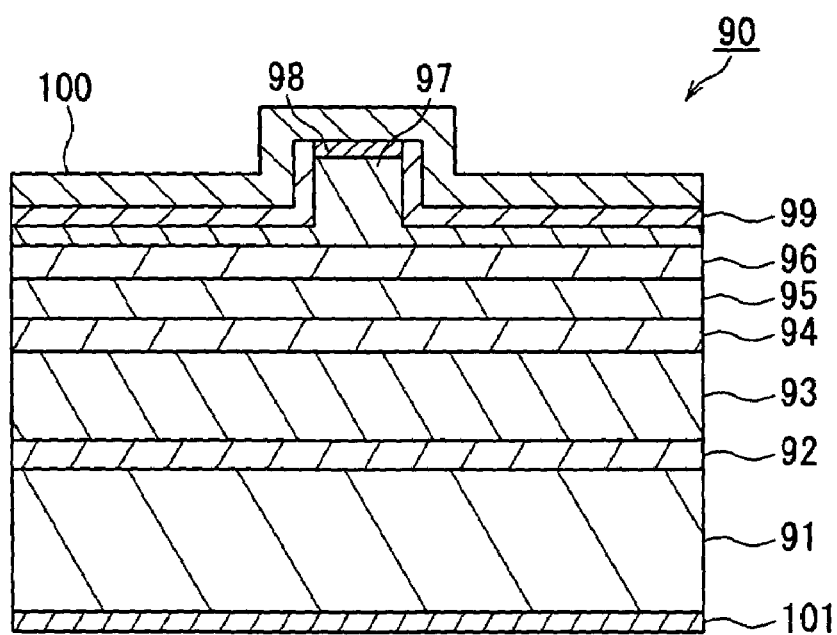
FIG. 9 is a cross-sectional view showing the configuration of still another example of semiconductor devices according to the present invention.

In the present example, the semiconductor laser was produced using the GaN single crystal substrate. However, preferably, a substrate is provided that has a low absorptance at a wavelength that is used in an optical device to be produced on the substrate. Accordingly, it is preferable that a substrate obtained by processing, by the processing method of the present invention, $Al_xGa_{1-x}N$ (where $0 \leq x \leq 1$) single crystals that contain a large amount of Al and have low absorptivity with respect to light with short wavelengths is used as the substrate for a semiconductor laser or a light emitting diode that emits light in the ultraviolet region. This also makes it possible to obtain ultraviolet lasers or light emitting diodes in which the threshold current is lower than conventional one and the variations thereof are small. In this example, the description was directed to the case where no impurities were added to the substrate 91. However, n-type impurities may be added to the substrate 91 and an n-side electrode 101 may be formed on the substrate 91 side as shown in FIG. 9.

The Group III nitride crystal semiconductor substrate of the present invention can be used for various semiconductor devices such as, for instance, laser diodes, light emitting diodes, and field effect transistors.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a Group III nitride crystal substrate, comprising a process of processing surfaces of Group III nitride crystals, wherein the process of processing the surfaces includes at least one of a process of meltback etching the surfaces by bringing the surfaces into contact with a melt and melting the surfaces, the melt including at least one of alkali metal and alkaline-earth metal and a process of mechanochemically polishing the surfaces using the melt.

2. The method of manufacturing a Group III nitride crystal substrate according to claim 1, further comprising, before the process of processing the surfaces, at least one of a process of mechanically processing the surfaces of the Group III nitride crystals and a process of mechanochemically polishing the surfaces.

3. The method of manufacturing a Group III nitride crystal substrate according to claim 1, wherein the Group III nitride crystal substrate is obtained by subjecting bulk crystals to slice processing.

4. The method of manufacturing a Group III nitride crystal substrate according to claim 1, wherein the alkali metal is at least one selected from the group consisting of Na, Li, K, Rb, and Cs while the alkaline-earth metal is at least one selected from the group consisting of Ca, Mg, Sr, Ba, and Be.

5. The method of manufacturing a Group III nitride crystal substrate according to claim 1, wherein the melt comprises Na and Ga.

6. The method of manufacturing a Group III nitride crystal substrate according to claim 1, wherein in the melt, one of the following formulae is satisfied:

$$0 \leq A/(A+M) \leq 0.10 \quad (1); \text{ and}$$

$$09 \leq A/(A+M) \leq 0.999 \quad (2),$$

where "A" denotes the number of moles of the Group III element and "M" denotes the number of total moles of the alkali metal and alkaline-earth metal.

7. The method of manufacturing a Group III nitride crystal substrate according to claim 1, wherein the melt used in the meltback etching has a temperature of 400° C. to 900° C.

8. The method of manufacturing a Group III nitride crystal substrate according to claim 1, wherein in the process of processing the surfaces, a damaged layer on the surfaces of the Group III nitride crystals is eliminated.

9. The method of manufacturing a Group III nitride crystal substrate according to claim 1, wherein in the process of processing the surfaces, concavities and convexities of the surfaces of the Group III nitride crystals have sizes of not more than ±5 μm.

10. The method of manufacturing a Group III nitride crystal substrate according to claim 1, wherein the melt is unsaturated.

11. The method of manufacturing a Group III nitride crystal substrate according to claim 1, wherein the melt further comprises a Group III element.

12. The method of manufacturing a Group III nitride crystal substrate according to claim 11, wherein the Group III element is at least one selected from the group consisting of Ga, Al, and In.

13. The method of manufacturing a Group III nitride crystal substrate according to claim 1, wherein the melt further comprises polishing grains.

14. The method of manufacturing a Group III nitride crystal substrate according to claim 13, wherein the polishing grains are at least one selected from the group consisting of alumina, diamond, SiC, GaN, and AlN.

15. The method of manufacturing a Group III nitride crystal substrate according to claim 1, wherein the process of processing the surfaces is carried out in an atmosphere containing at least one selected from the group consisting of $N_2$ gas, $NH_3$ gas, and $H_2$ gas.

16. The method of manufacturing a Group III nitride crystal substrate according to claim 15, wherein the atmosphere has a pressure of 1 atm ($1 \times 1.013 \times 10^5$ Pa) to 10 atm ($10 \times 1.013 \times 10^5$ Pa).

17. The method of manufacturing a Group III nitride crystal substrate according to claim 1, further comprising a process of growing the Group III nitride crystals by at least one of vapor phase growth and liquid phase growth.

18. The method of manufacturing a Group III nitride crystal substrate according to claim 17, wherein the liquid phase growth is a method of growing Group III nitride crystals in a melt or at a surface of the melt in an atmosphere including nitrogen, with the melt containing nitrogen, at least one of alkali metal and alkaline-earth metal, and at least one Group III element selected from the group consisting of gallium, aluminum, and indium.

19. The method of manufacturing a Group III nitride crystal substrate according to claim 18, wherein a semiconductor seed layer of a Group III element compound is prepared, and then the Group III nitride crystals are grown on the semiconductor seed layer.

20. The method of manufacturing a Group III nitride crystal substrate according to claim 19, wherein the liquid phase growth is carried out in two stages including a first stage and a second stage, the first stage corresponds to a process of forming, on the semiconductor seed layer, a first semiconductor layer having a higher defect density than that of the semiconductor seed layer, and the second stage corresponds to a process of forming, on the first semiconductor layer, a second semiconductor layer having a lower defect density than that of the first semiconductor layer.

21. The method of manufacturing a Group III nitride crystal substrate according to claim 20, further comprising a process of removing at least the first semiconductor layer to provide a free-standing Group III nitride crystal substrate that is formed of the second semiconductor layer.

22. The method of manufacturing a Group III nitride crystal substrate according to claim 20, further comprising a process of removing the semiconductor seed layer.

23. The method of manufacturing a Group III nitride crystal substrate according to claim 20, wherein the semiconductor seed layer is formed on a base substrate.

24. A method of manufacturing a Group III nitride crystal substrate, comprising:
(i) preparing a semiconductor seed layer of a Group III element compound;
(ii) growing, on the semiconductor seed layer, a first semiconductor layer through liquid phase growth, the first semiconductor layer having a higher defect density than that of the semiconductor seed layer;
(iii) growing, on the first semiconductor layer, a second semiconductor layer through liquid phase growth, the second semiconductor layer having a lower defect density than that of the first semiconductor layer; and
(iv) removing at least the semiconductor seed layer and the first semiconductor layer to obtain a free-standing Group III nitride crystal substrate formed of the second semiconductor layer.

25. The method of manufacturing a Group III nitride crystal substrate according to claim 24, further comprising a process of processing surfaces of Group III nitride crystals, wherein the process of processing the surfaces includes at least one of a process of meltback etching the surfaces by bringing the surfaces into contact with a melt including at least one of alkali metal and alkaline-earth metal, a process of mechanochemically polishing the surfaces using the melt, a process of mechanically processing the surfaces and a process of mechanochemically polishing the surfaces.

26. The method of manufacturing a Group III nitride crystal substrate according to claim 24, wherein the semiconductor seed layer is formed on a base substrate.

27. A method of manufacturing a Group III nitride crystal substrate, comprising:
(I) preparing a semiconductor seed layer of a Group III element compound;
(II) growing, on the semiconductor seed layer, a first semiconductor layer through liquid phase growth, the first semiconductor layer having a higher defect density than that of the semiconductor seed layer;
(III) growing, on the first semiconductor layer, a second semiconductor layer through liquid phase growth, the second semiconductor layer having a lower defect density than that of the first semiconductor layer; and
(IV) processing a surface of the second semiconductor layer.

28. The method of manufacturing a Group III nitride crystal substrate according to claim 27, wherein the processing is carded out by at least one meltback etching the surfaces by bringing the surfaces into contact with a melt including at least one of alkali metal and alkaline-earth metal, mechanochemically polishing the surfaces using the melt, mechanically processing the surfaces and mechanochemically polishing the surfaces.

29. The method of manufacturing a Group III nitride crystal substrate according to claim 27, wherein the semiconductor seed layer is formed on a base substrate.

* * * * *

UNITED STATES PATENT AND TRADEMARK OFFICE
CERTIFICATE OF CORRECTION

PATENT NO. : 7,125,801 B2
APPLICATION NO. : 10/911939
DATED : October 24, 2006
INVENTOR(S) : Minemoto et al.

It is certified that error appears in the above-identified patent and that said Letters Patent is hereby corrected as shown below:

Title page, second column, line 2 of Foreign Patent Documents: "2001013385" should read --2004/013385--.
Title page, second column line 1 of Other Publications: "Transpatent" should read --Transparent--.
Title page, second column, line 6 of Other Publications: "crystal" should read --crystals--.
Column 21, line 7(claim 6): "09≤A/(A+M)≤0.999" should read --0.9≤A/(A+M)≤0.999--.
Column 21, line 40(claim 14): "AIN" should read --AlN--.
Column 22, line 67(claim 28): "carded" should read --carried--.

Signed and Sealed this

Twenty-ninth Day of May, 2007

JON W. DUDAS
*Director of the United States Patent and Trademark Office*

UNITED STATES PATENT AND TRADEMARK OFFICE
CERTIFICATE OF CORRECTION

PATENT NO. : 7,125,801 B2  Page 1 of 1
APPLICATION NO. : 10/911939
DATED : October 24, 2006
INVENTOR(S) : Minemoto et al.

It is certified that error appears in the above-identified patent and that said Letters Patent is hereby corrected as shown below:

Title page, item [73]: second-listed assignee: --Yusuke Mori, Osaka (JP)-- should appear.

Signed and Sealed this

Second Day of October, 2007

JON W. DUDAS
*Director of the United States Patent and Trademark Office*